(12) United States Patent
La Tulipe, Jr. et al.

(10) Patent No.: US 7,875,528 B2
(45) Date of Patent: Jan. 25, 2011

(54) METHOD, SYSTEM, PROGRAM PRODUCT FOR BONDING TWO CIRCUITRY-INCLUDING SUBSTRATES AND RELATED STAGE

(75) Inventors: Douglas C. La Tulipe, Jr., New Fairfield, CT (US); Steven E. Steen, Peekskill, NY (US); Anna W. Topol, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 863 days.

(21) Appl. No.: 11/672,217

(22) Filed: Feb. 7, 2007

(65) Prior Publication Data

US 2008/0188036 A1 Aug. 7, 2008

(51) Int. Cl.
*H01L 21/30* (2006.01)
(52) U.S. Cl. .............. 438/455; 438/106; 438/107; 438/108; 438/109; 438/110; 438/111; 438/112; 438/113; 438/114; 438/115; 438/116; 438/117; 438/118; 438/119; 438/120; 438/121; 438/122; 438/123; 438/125; 438/124; 438/126; 438/127; 438/52; 257/432
(58) Field of Classification Search .............. 438/455; 355/53
See application file for complete search history.

(56) References Cited

U.S. PATENT DOCUMENTS

| | | | |
|---|---|---|---|
| 3,858,978 A | | 1/1975 | Johannsmeier |
| 5,523,254 A | | 6/1996 | Satoh et al. |
| 5,558,015 A | * | 9/1996 | Miyashita et al. ............. 100/50 |
| 5,947,027 A | * | 9/1999 | Burgin et al. ................ 101/474 |
| 6,183,067 B1 | * | 2/2001 | Matta .......................... 347/65 |
| 6,211,598 B1 | * | 4/2001 | Dhuler et al. ................ 310/307 |
| 6,377,438 B1 | * | 4/2002 | Deane et al. ................. 361/278 |
| 6,556,281 B1 | | 4/2003 | Govil et al. |
| 6,653,639 B1 | * | 11/2003 | Novak ...................... 250/491.1 |
| 6,717,167 B2 | | 4/2004 | Noda |
| 6,734,117 B2 | * | 5/2004 | Sogard ........................ 438/795 |
| 6,774,651 B1 | | 8/2004 | Hembree |
| 6,830,985 B2 | | 12/2004 | Oi et al. |

(Continued)

OTHER PUBLICATIONS

Warner, K. et al., "An Investigation of Wafer-to-Wafer Alignment Tolerances for Three-Dimensional Integrated Circuit Fabrication", 2004 IEEE International SOI Conference (IEEE Cat. No. 04CH37573), pp. 71-72, Oct. 2004.

(Continued)

*Primary Examiner*—Fernando L Toledo
*Assistant Examiner*—Ankush k Singal
(74) *Attorney, Agent, or Firm*—Louis J. Percello; Hoffman Warnick LLC

(57) ABSTRACT

A method, system and program product for bonding two circuitry-including semiconductor substrates, and a related stage, are disclosed. In one embodiment, a method of bonding two circuitry-including substrates includes: providing a first stage for holding a first circuitry-including substrate and a second stage for holding a second circuitry-including substrate; identifying an alignment mark on each substrate; determining a location and a topography of each alignment mark using laser diffraction; creating an alignment model for each substrate based on the location and topography the alignment mark thereon; and bonding the first and second circuitry-including substrates together while aligning the first and second substrate based on the alignment model.

6 Claims, 7 Drawing Sheets

U.S. PATENT DOCUMENTS

| | | | |
|---|---|---|---|
| 6,936,493 B1* | 8/2005 | Michalicek | 438/52 |
| 6,950,758 B2 | 9/2005 | Morford | |
| 6,967,145 B2 | 11/2005 | Tseng et al. | |
| 6,995,039 B2* | 2/2006 | Harris et al. | 438/107 |
| 7,113,255 B2 | 9/2006 | Poultney et al. | |
| 7,141,450 B2* | 11/2006 | Pardo | 438/108 |
| 7,204,686 B2* | 4/2007 | Chung et al. | 425/385 |
| 7,300,532 B2* | 11/2007 | Hashizume et al. | 156/64 |
| 7,338,613 B2* | 3/2008 | Schueller et al. | 216/41 |
| 7,349,140 B2* | 3/2008 | Yang | 359/254 |
| 7,357,035 B2* | 4/2008 | Liu et al. | 73/756 |
| 7,433,038 B2* | 10/2008 | Bijnen et al. | 356/400 |
| 2002/0164111 A1* | 11/2002 | Mirza | 385/18 |
| 2003/0013274 A1 | 1/2003 | Noda | |
| 2003/0118308 A1* | 6/2003 | Bricheno | 385/129 |
| 2003/0179353 A1* | 9/2003 | Yamauchi et al. | 355/53 |
| 2003/0213382 A1 | 11/2003 | Kendale et al. | |
| 2004/0026756 A1* | 2/2004 | Yoshida et al. | 257/432 |
| 2004/0075364 A1 | 4/2004 | Mehta | |
| 2005/0111794 A1* | 5/2005 | Wang et al. | 385/52 |
| 2005/0140946 A1 | 6/2005 | Tsuji et al. | |
| 2005/0145021 A1* | 7/2005 | Chand et al. | 73/105 |
| 2005/0186517 A1* | 8/2005 | Kochersperger | 430/327 |
| 2005/0255666 A1* | 11/2005 | Yang | 438/401 |
| 2006/0141743 A1* | 6/2006 | Best et al. | 438/455 |
| 2006/0150709 A1* | 7/2006 | Deb et al. | 73/1.38 |
| 2006/0172507 A1* | 8/2006 | Best et al. | 438/455 |
| 2006/0207116 A1* | 9/2006 | Vaccaro | 33/286 |
| 2007/0135013 A1* | 6/2007 | Faris | 445/49 |
| 2007/0222820 A1* | 9/2007 | Barnes et al. | 347/54 |
| 2007/0266557 A1* | 11/2007 | Drost et al. | 29/834 |
| 2009/0115042 A1* | 5/2009 | Koyanagi | 257/686 |

OTHER PUBLICATIONS

Suga, T. et al., "A New Wafer-Bonder of Ultra-High Precision Using Surface Activated Bonding(SAB) Concept", 2001 Proceedings, 51st Electronic Components and Technology Conference, (Cat. No. 01CH37220), pp. 1013-1018, May 2001.

* cited by examiner

METHOD, SYSTEM, PROGRAM PRODUCT FOR BONDING TWO CIRCUITRY-INCLUDING SUBSTRATES AND RELATED STAGE

This invention was made with U.S. Government support under Contract No.: N66001-04-C-8032 awarded by the Defense Advanced Research Projects Agency (DARPA). The U.S. Government has certain rights in this invention.

BACKGROUND OF THE INVENTION

1. Technical Field

The invention relates generally to integrated circuit (IC) chip fabrication, and more particularly, to a method, system and program product for bonding two circuitry-including substrates, and a related stage.

2. Background Art

In the semiconductor device fabrication industry, three dimensional integration (3DI) techniques may be used for integration at the component level as a packaging process or at the device/circuit level. Device/circuit level 3DI includes the combining of different substrates (i.e., wafers), each having patterned circuitry formed thereon, in a manner to form a larger device/circuit by matching appropriate circuit parts together. More specifically, two substrates are placed in contact with each other in an aligned manner, and pressure is applied to initiate the bonding of the two substrates. In conventional non-patterned substrate bonding (i.e., no circuitry matching performed), the alignment between the two starting substrates is not critical, as it requires only general alignment (e.g., notch-to-notch) with typical alignment accuracy of approximately 5 µm. However, for device/circuit level 3DI applications, the alignment between the two substrates becomes critical due to the circuit connections that need to be made between the patterned circuitry within each substrate. The better the bonding alignment capability, the less misalignment tolerance that needs to be built into circuit designs and therewith the silicon area used for the integrated circuit A major challenge to advancement of device/circuit level 3DI is obtaining enough accuracy to enable stacked structures in the front-end-of-line (FEOL), i.e., processing performed on the semiconductor substrate in the course of device manufacturing up to first metallization. Currently, the 3DI alignment industry is limited to 1.0 um to 1.5 um alignment accuracy. Attempts at obtaining sub-micron accuracy show that, as alignment capability improves in terms of better control of rotation and translation in a lateral (X and Y) direction, differences in substrate materials such as material thermodynamics, flatness, etc., become major contributors to misalignment. One approach to one of these issues, flatness, has been to provide piezo-electric actuators in a stage to which a substrate is attached to provide mechanical corrections in a surface of the substrate. Unfortunately, this approach suffers from a number of shortcomings. First, because the mechanical correction is not granulated, it is incapable of addressing all of the above-mentioned misalignment contributors. Furthermore, a mechanical correction is limited in its ability to correct for more minor contributors to mis-alignment.

SUMMARY OF THE INVENTION

A method, system and program product for bonding two circuitry-including semiconductor substrates, and a related stage, are disclosed. In one embodiment, a method of bonding two circuitry-including substrates includes: providing a first stage for holding a first circuitry-including substrate and a second stage for holding a second circuitry-including substrate; identifying an alignment mark on each substrate; determining a location and a topography of each alignment mark; creating an alignment model for each substrate based on the location and topography the alignment mark thereon; and bonding the first and second circuitry-including substrates together while aligning the first and second substrate based on the alignment model.

A first aspect of the invention provides a method of bonding two circuitry-including substrates, the method comprising: providing a first stage for holding a first circuitry-including substrate and a second stage for holding a second circuitry-including substrate; identifying an alignment mark on each substrate; determining a location and a topography of each alignment mark; creating an alignment model for each substrate based on the location and topography of the alignment mark thereon; and bonding the first and second circuitry-including substrates together while aligning the first and second substrates based on the alignment model.

A second aspect of the invention provides a system for bonding two circuitry-including substrates, the system comprising: a first stage for holding a first circuitry-including substrate and a second stage for holding a second circuitry-including substrate; means for identifying an alignment mark on each substrate; means for determining a location and topography of each alignment mark; means for creating an alignment model for each substrate based on the alignment mark locations and topographies; and means for bonding the first and second circuitry-including substrates together while aligning the first and second substrates based on the alignment model.

A third aspect of the invention provides a program product stored on a computer-readable medium, which when executed, directs bonding of two circuitry-including substrates, the program product comprising: program code for identifying an alignment mark on each substrate; program code for determining a location and a topography of each alignment mark; program code for creating an alignment model for each substrate based on the location and topography the alignment mark thereon; and program code for directing bonding of the first and second circuitry-including substrates together while aligning the first and second substrates based on the alignment model.

A fourth aspect is directed to a stage for holding a substrate, the stage comprising: a plurality of thermal actuators for thermally adjusting a plurality of zones on the substrate.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
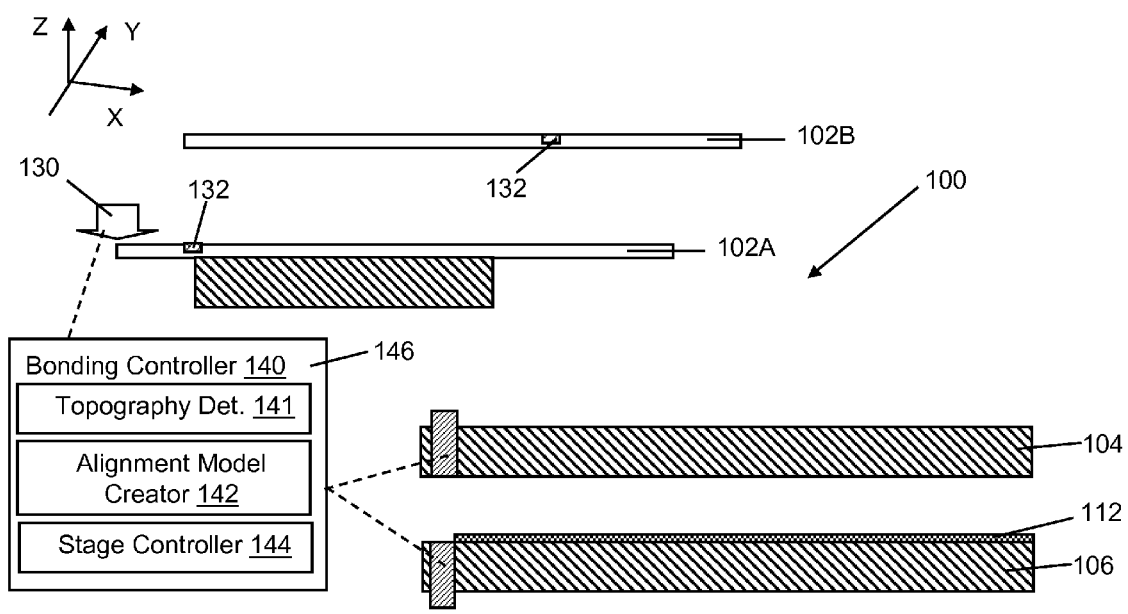
FIGS. 1-7 show embodiments of a system, method and program product for bonding two circuitry-including substrates according to the invention, with FIG. 2 showing a related stage for a substrate.

Turning to the drawings, FIG. 1 shows embodiments of a system 100 for bonding two circuitry-including substrates 102A, 102B. Each circuitry-including substrate 102A, 102B may include, for example, a semiconductor wafer having patterned circuitry (not shown) in a surface thereof. Dielectric material may surround the circuitry. Circuitry in one substrate 102A is meant to be aligned and bonded with corresponding circuitry in substrate 102B to form a larger device/circuit.

System 100 includes a first stage 104 for holding a first circuitry-including substrate 102A and a second stage 106 for holding a second circuitry-including substrate 102B. At least one stage 104, 106 may include any now known or later developed mechanisms for controlling lateral X, Y and vertical Z movement, e.g., pneumatic controllers, motors, transmission systems, etc. Each stage 104, 106 may further include conventional structure such as a vacuum or mechanical coupler (not shown) for holding a substrate 102A, 102B to the stage. As the detail of these mechanisms is known in the art, no further description is necessary.

Figure 2:
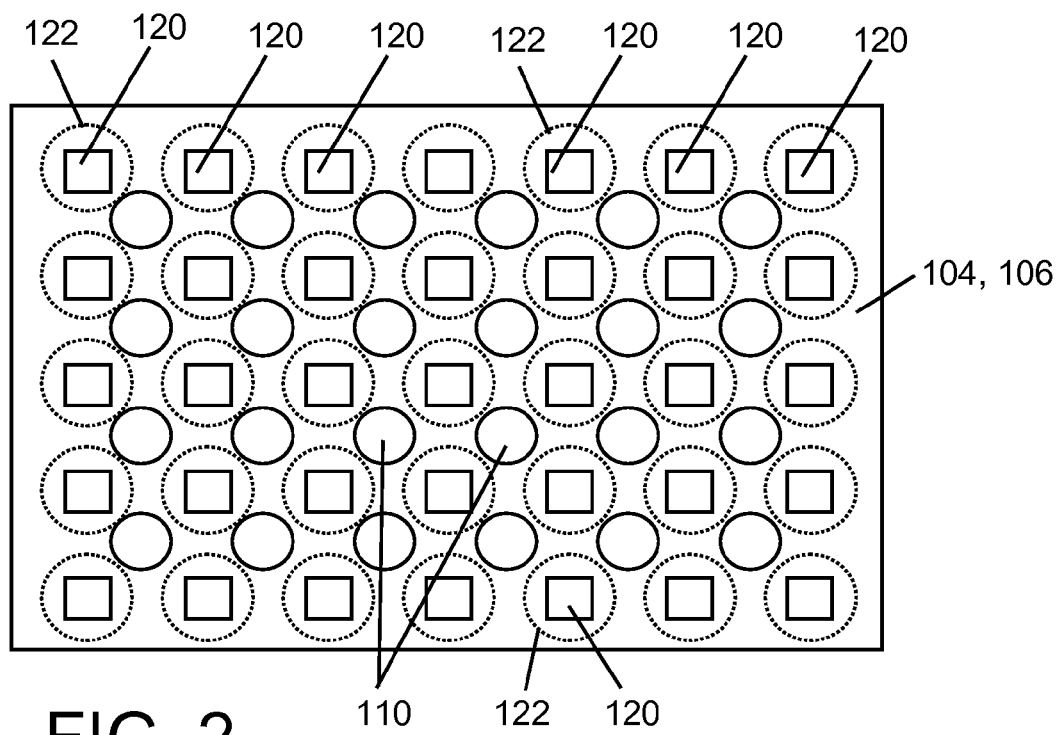

As shown in FIG. 2, according to one embodiment each stage 104, 106 also includes a plurality of piezoelectric devices 110, which include piezoelectric actuators and sensors, for mechanically adjusting, e.g., forming a bow or correcting a bow, of a substrate 102A, 102B attached thereto and for sensing force applied thereto. Piezoelectric actuators of piezoelectric devices 110 are distributed substantially uniformly over stages 104, 106—any number may be provided. Piezoelectric actuators of piezoelectric devices 110 may be positioned below a flexible membrane 112 (stage 106 in FIG. 1 only). In addition, according to one embodiment, each stage 104, 106 also includes a plurality of thermal actuators 120 for thermally adjusting at least one of a plurality of zones 122 on at least one of the substrates 102A, 102B (FIG. 1), i.e., via bonding controller 140 (FIG. 1). That is, each thermal actuator 120 may thermally adjust one or more zones 122. The thermal adjustment provided by thermal actuator 120 may correct for a local error and/or a substrate bow. Although each zone 122 is shown concentrically about each thermal actuator 120, it is understood that the thermal change generated by each actuator 120 may not be concentric thereabout. In addition, a zone 122 may overlap with adjacent zones. Each thermal actuator 120 may be capable of heating alone, cooling alone or both. In one embodiment, each thermal actuator 120 includes a Peltier element, which includes a junction of two metals through which an electric current may be passed to cause a temperature increase or decrease therein. Alternatively, each thermal actuator 120 may include a resistive element, for example, where heating only is required. A resistive element may include a material that provides electrical resistance and heats up when a current is applied thereto. A combination of Peltier element(s) and resistive element(s) may also be employed. In either case, the amount of thermal shift desired can be calibrated to the type(s) of devices used for precision control. The temperature change is transmitted to zone 122 of the respective stage 104,106, and subsequently to a corresponding zone of a substrate 102A, 102B, as will be described in greater detail below. Although each stage 104, 106 is illustrated in a polygonal shape, it is understood that other shapes are also possible.

Returning to FIG. 1, system 100 also includes an alignment mark identifier 130 for identifying an alignment mark(s) 132 (greatly enlarged for clarity) on each substrate 102A, 102B (only one shown on each, but could be any number). An alignment mark 132 may be any now known or later developed structure identifiable, e.g., using a laser, from a surface of a substrate 102A, 102B. Alignment marks 132 are common in substrates 102A, 102B for purposes of locating circuitry on a substrate 102A, 102B for photolithography purposes. However, these alignment marks have never been employed as mechanisms for alignment during bonding of substrates. Alignment marks 132 alone, however, are not satisfactory for alignment and bonding to the accuracy required for three dimensional integration (3DI) at the device/circuit level. Alignment mark identifier 130 may include any now known or later identified infrared, visible light, laser based system or a form of image recognition.

Furthermore, system 100 includes a bonding controller 140 including a topography determinator (Det.) 141, an alignment model creator 142 and a stage controller 144. As will be described in greater detail below, topography determinator 141 determines a topography of structures on each substrate 102A, 102B, alignment model creator 142 creates an alignment model based on the topographies, and stage controller 144 controls movement of at least one of stages 104, 106.

Bonding controller 140 may include a computer infrastructure 146, e.g., including a computing device, that can perform the various process steps described herein. The computing device may include a memory, a processor (PU), an input/output (I/O) interface, and a bus. Further, the computing device may be in communication with an external I/O device/resource and a storage system. As is known in the art, in general, the PU executes computer program code, such as alignment model creator 142, that is stored in memory and/or a storage system. While executing computer program code, the PU can read and/or write data to/from memory, a storage system, and/or I/O interface.

In any event, the computing device can comprise any general purpose computing article of manufacture capable of executing computer program code installed by a user (e.g., a personal computer, server, handheld device, etc.). However, it is understood that the computing device and bonding controller 140 are only representative of various possible equivalent computing devices that may perform the various process steps of the invention. To this extent, in other embodiments, the computing device can comprise any specific purpose computing article of manufacture comprising hardware and/or computer program code for performing specific functions, any computing article of manufacture that comprises a combination of specific purpose and general purpose hardware/software, or the like. In each case, the program code and hardware can be created using standard programming and engineering techniques, respectively.

Similarly, bonding controller 140 is only illustrative of various types of computer infrastructures 146 for implementing the invention. For example, in one embodiment, bonding controller 140 comprises two or more computing devices (e.g., a server cluster) that communicate over any type of wired and/or wireless communications link, such as a network, a shared memory, or the like, to perform the various process steps of the invention. When the communications link comprises a network, the network can comprise any combination of one or more types of networks (e.g., the Internet, a wide area network, a local area network, a virtual private network, etc.). Network adapters may also be coupled to the system to enable the data processing system to become coupled to other data processing systems or remote printers or storage devices through intervening private or public networks. Modems, cable modem and Ethernet cards are just a few of the currently available types of network adapters. Regardless, communications between the computing devices may utilize any combination of various types of transmission techniques.

Figure 3:
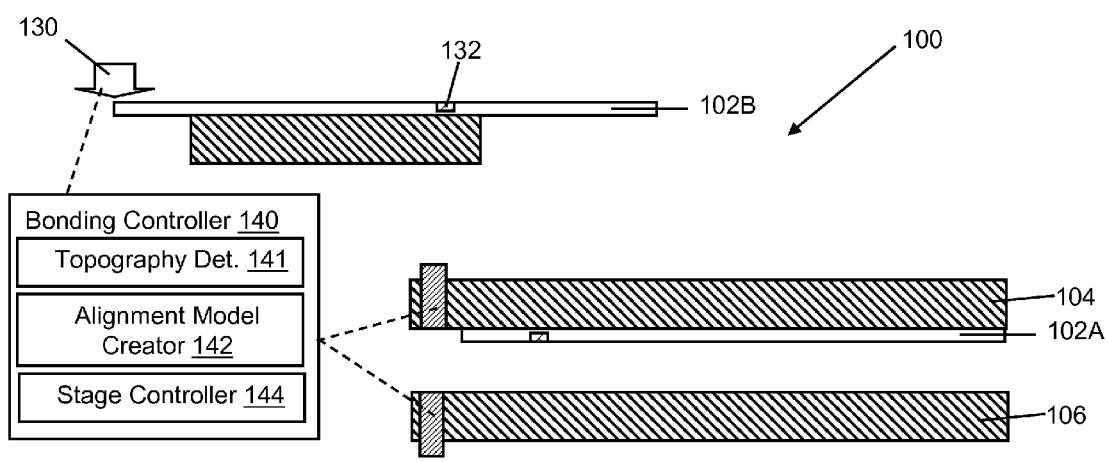

Referring to FIGS. 1-7 collectively, embodiments of a method of bonding two circuitry-including substrates 102A, 102B with system 100 will now be described. In FIG. 1, a first stage 104 for holding a first circuitry-including substrate 102A and a second stage 106 for holding a second circuitry-including substrate 102B are provided, as described above. At this point, the process may include ancillary processes such as loading substrates 102A, 102B, performing a (solvent) clean in preparation of bonding, and pre-aligning substrates 102A, 102B based on their respective alignment notches, etc. Next, as shown in FIG. 1, alignment mark identifier 130 identifies an alignment mark(s) 132 on each substrate 102A, 102B. Note, that the identification for each substrate 102A, 102B does not necessarily have to occur simultaneously or immediately sequentially. For example, FIG. 1 shows alignment mark identifier 130 identifying an alignment mark 132 for substrate 102A only, and FIG. 3 shows substrate 102A loaded to first stage 104 after having been flipped over, and substrate 102B being evaluated by alignment mark identifier 130. In addition, it may be the case that the location of alignment marks 132 are already known, e.g., by prior photolithography processes, or by design, in which case the identification processes may be omitted.

Figure 4:
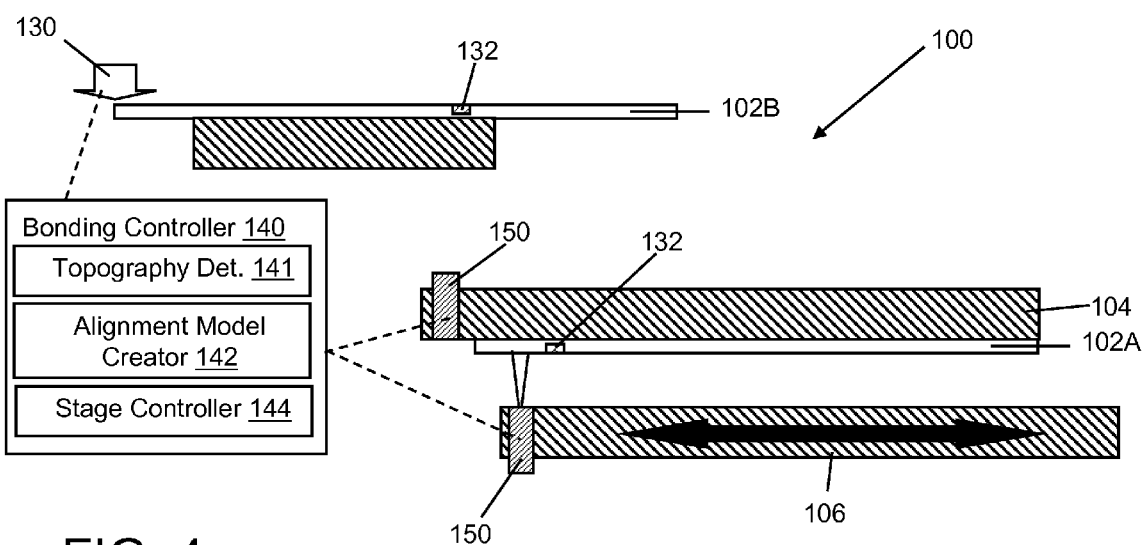

FIG. 4 shows topography determinator 141 determining a location (in X, Y coordinates) and a topography (in Z coordinate) of alignment mark(s) 132 using laser diffraction. More specifically, each substrate 102A, 102B includes circuit structure in a surface thereof and may include localized anomalies (e.g., particle contamination, larger or smaller than intended structure, etc.) that must be addressed to improve the accuracy of bonding alignment. The location and topography of each alignment mark, which are typically dispersed about substrates 102A, 102B, provide a representation of the overall topography of the substrates 102A, 102B. That is, the topography includes Z coordinates of structures, including local anomalies, and also a substrate bow of substrates 102A, 102B. The number of data points collected and evaluated can be user defined. In the embodiment shown, one stage 104 or 106 includes measurement optics 150 (e.g., laser) to measure the diffraction. Measurement optics 150 may include an optical path through a respective stage 104,106 and equipment to perform diffraction, inter-ferometric, grazing angle, reflective or other measurement techniques for topography and location determination. The respective stage 104 or 106 (in this case, stage 106) may be moved using stage controller 144. Measurement optics 150 is directed by topography determinator 141 to determine the topography of a substrate 102A, 102B on an opposite stage 104,106. However, it is understood that measurement optics 150 may be separately mounted and movable.

Figure 5:
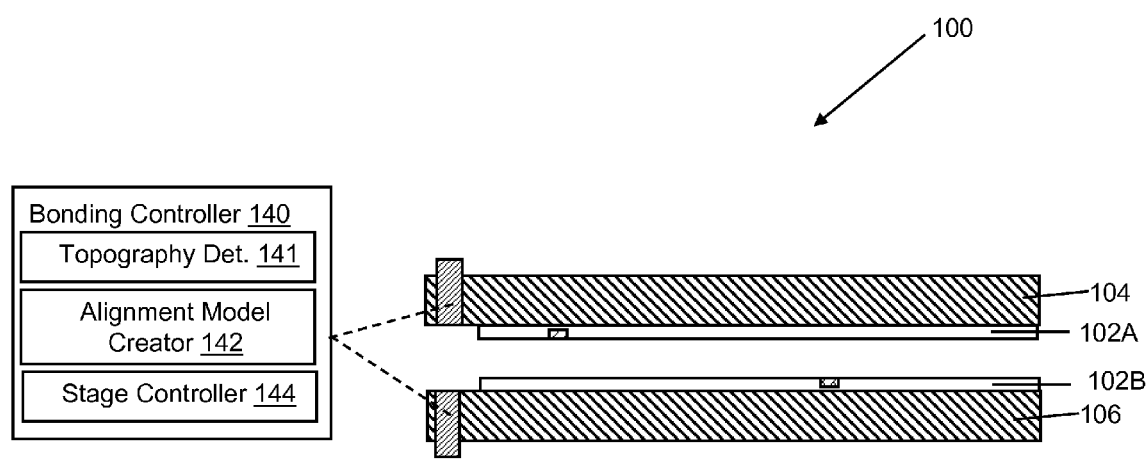

For efficiency, during the FIG. 4 process, an alignment mark(s) 132 may be identified by alignment mark identifier 130 for substrate 102B. FIG. 5 shows second substrate 102B loaded onto second stage 106. No flipping of second substrate 102B is necessary.

Figure 6:
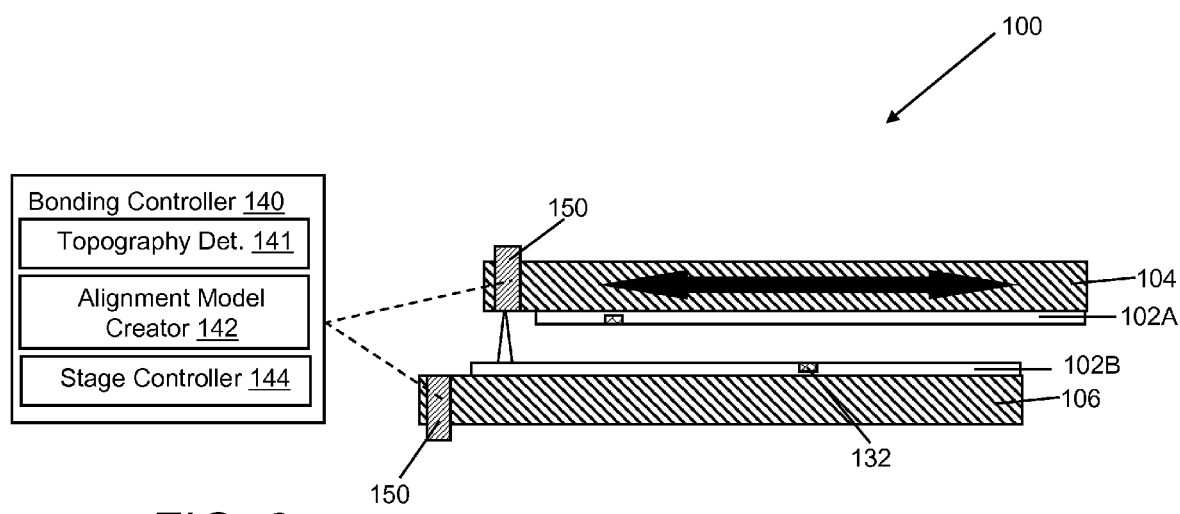

FIG. 6 shows topography determinator 141 determining a location and a topography of an alignment mark 132 on substrate 102B using laser diffraction in a manner substantially similar to that described above relative to substrate 102A. In this case, however, first stage 104 is moved to scan measurement optics 150, using stage controller 144, over second substrate 102B. However, it is understood that measurement optics 150 may be separately mounted and movable.

At this point, alignment model creator 142 creates an alignment model for substrates 102A, 102B based on the location and topography of alignment mark(s) 132 of substrates 102A, 102B. More specifically, each substrate 102A, 102B includes localized anomalies (or errors) that must be addressed to improve the accuracy of bonding alignment. Alignment model creator 142 creates a model for adjusting the topography of substrate 102A, 102B based on alignment marks 132 during bonding so as to achieve a more accurate bonding alignment. More specifically, rather than simply evaluating conventional parameters such as translational and rotation data, the alignment model incorporates translation data, rotation data, magnification data and substrate bow data. Alignment model creator 142 uses this data to generate an alignment model that includes localized corrections, e.g., by zones 122 (FIG. 2).

Figure 7:
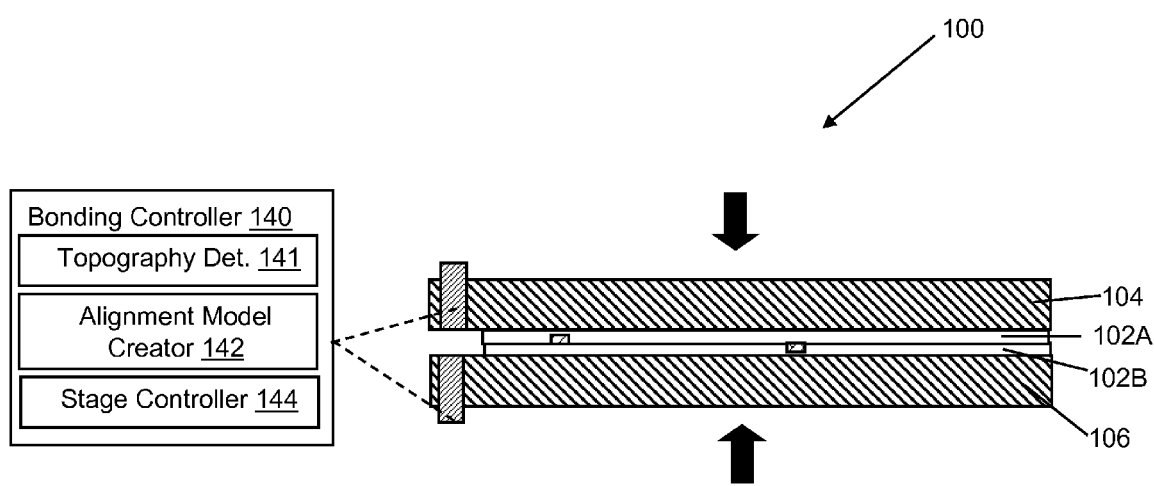

In FIG. 7, bonding controller 140 directs bonding of first and second circuitry-including substrates 102A, 102B together while aligning first and second substrates 102A, 102B based on the alignment model. Bonding begins at the center of substrates 102A, 102B by moving stages 104, 106 together, e.g., via stage controller 144. Alignment marks 132 may be used to ensure proper alignment using the alignment model. Note, however, that alignment marks 132 do not necessarily have to be aligned relative to one another in order for the benefits of knowing and using their location to be achieved. Prior to bonding and/or simultaneously therewith localized corrections can be made to the substrates 102A, 102B based on the alignment model. For example, localized or global mechanical adjustments can be made via piezoelectric devices 110, i.e., the actuators thereof (FIG. 2), to adjust for, for example, substrate bow differences. The progression of a bond front may be determined based on the force sensed by piezoelectric devices 110, i.e., the sensors thereof. The bond front progression may then be used to enable real-time modification of substrate contour to achieve the best bonding results. Furthermore, the bonding may include thermally adjusting at least one of a plurality of zones 122 on at least one of substrates 102A, 102B based on the topography. When thermal actuators 120 (FIG. 2) are closely placed together and well distributed across a surface of a stage 104, 106, it allows precise tuning of substrate 102A, 102B expansion at those points, molding the shape to the required alignment tolerance. In this case, one can maximize substrate to substrate alignment by, for example, controlling image shifts due to substrate temperature, i.e., magnification errors related to different coefficient of thermal expansion (CTE) issues. That is, localized thermal adjustments can be made via thermal actuators 122 (FIG. 2) so as to achieve a much more granulated alignment adjustment. Bonding controller 140 may also use the alignment model to evaluate for proper alignment as bonding progresses. The above-described method, system and program product may achieve alignment accuracy below 0.25 μm.

While shown and described herein as a method and system for bonding two circuitry-including substrates, it is understood that the invention further provides various alternative embodiments. That is, the invention can take the form of an entirely hardware embodiment, an entirely software embodiment or an embodiment containing both hardware and software elements. In a preferred embodiment, the invention is implemented in part in software, which includes but is not limited to firmware, resident software, microcode, etc. In one embodiment, the invention can take the form of a computer program product accessible from a computer-usable or computer-readable medium providing program code for use by or in connection with a computer or any instruction execution system, which when executed, enables a computer infrastructure to bond two circuitry-including substrates. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a tape, a rigid magnetic disk and an optical disk. Current examples of optical disks include compact disk—read only memory (CD-ROM), compact disk—read/write (CD-R/W) and DVD.

A data processing system suitable for storing and/or executing program code will include at least one processing unit coupled directly or indirectly to memory elements through a system bus. The memory elements can include local memory, e.g., memory, employed during actual execution of the program code, bulk storage (e.g., a memory system), and cache memories which provide temporary storage of at least some program code in order to reduce the number of times code must be retrieved from bulk storage during execution.

As used herein, it is understood that the terms "program code" and "computer program code" are synonymous and mean any expression, in any language, code or notation, of a set of instructions that cause a computing device having an information processing capability to perform a particular function either directly or after any combination of the following: (a) conversion to another language, code or notation; (b) reproduction in a different material form; and/or (c) decompression. To this extent, program code can be embodied as one or more types of program products, such as an application/software program, component software/a library of functions, an operating system, a basic I/O system/driver for a particular computing and/or I/O device, and the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method of bonding two circuitry-including substrates, the method comprising:
   providing a first stage for holding a first circuitry-including substrate and a second stage for holding a second circuitry-including substrate;
   identifying an alignment mark on each substrate;
   determining a location and a topography of each alignment mark on each substrate, wherein the location and the topography are determined using laser diffraction;
   creating an alignment model for each substrate based on the location and topography of the alignment mark thereon; and
   bonding the first and second circuitry-including substrates together while aligning the first and second substrates based on the alignment model, wherein the bonding includes thermally adjusting at least one of a plurality of zones on at least one of the substrates based on the topography.

2. The method of claim 1, wherein the thermally adjusting includes correcting for at least one of a local error and a substrate bow.

3. The method of claim 1, wherein the providing includes providing each stage with a plurality of thermal actuators.

4. The method of claim 1, wherein the alignment model incorporates translation data, rotation data, magnification data and substrate bow data.

5. The method of claim 3, wherein the plurality of thermal actuators each includes at least one of a Peltier element and a resistive element.

6. The method of claim 3, wherein the providing further includes providing each stage with a plurality of piezoelectric devices, each piezoelectric device including an actuator and a sensor, and the bonding further includes mechanically adjusting at least one of the substrates using the actuator of the piezoelectric device.

* * * * *